United States Patent
Fredeman et al.

(10) Patent No.: US 9,047,930 B2
(45) Date of Patent: Jun. 2, 2015

(54) SINGLE-ENDED LOW-SWING POWER-SAVINGS MECHANISM WITH PROCESS COMPENSATION

(71) Applicant: International Business Machines Corporation, Armonk, NY (US)

(72) Inventors: Gregory J. Fredeman, Wappingers Falls, NY (US); Abraham Mathews, Austin, TX (US); Donald W. Plass, Poughkeepsie, NY (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 13/951,801

(22) Filed: Jul. 26, 2013

(65) Prior Publication Data

US 2015/0029803 A1 Jan. 29, 2015

(51) Int. Cl.
  *G11C 7/00* (2006.01)
  *G11C 7/12* (2006.01)
(52) U.S. Cl.
  CPC .......................................... *G11C 7/12* (2013.01)
(58) Field of Classification Search
  USPC .................... 365/203, 204, 185.18, 185.25
  See application file for complete search history.

(56) References Cited

U.S. PATENT DOCUMENTS

| | | | |
|---|---|---|---|
| 6,747,892 B2 * | 6/2004 | Khalid | 365/185.03 |
| 6,977,860 B1 | 12/2005 | Tooher et al. | |
| 7,082,069 B2 * | 7/2006 | Chou et al. | 365/203 |
| 7,463,539 B2 * | 12/2008 | Lin | 365/203 |
| 7,555,048 B1 | 6/2009 | Massoumi et al. | |
| 7,701,785 B2 * | 4/2010 | Sanjeevarao et al. | 365/189.09 |
| 2005/0030817 A1 | 2/2005 | Luk et al. | |
| 2006/0039179 A1 | 2/2006 | Luk et al. | |

(Continued)

FOREIGN PATENT DOCUMENTS

WO  WO 2005/013490 A1  2/2005

OTHER PUBLICATIONS

Hamzaoglu, Fatih et al., "Dual-Vt SRAM Cells with Full-Swing Single-Ended Bit Line Sensing for High-Performance On-Chip Cache in 0.13 μm Technology Generation", ISLPED'00, http://www.cecs.uci.edu/~papers/compendium94-03/papers/2000/islped00/pdf-files/01_2.pdf, Rapallo, Italy, 2000, 5 pages.

(Continued)

*Primary Examiner* — Pho M Luu
(74) *Attorney, Agent, or Firm* — Francis Lammes; Stephen J. Walder, Jr.; Parashos T. Kalaitzis (57) ABSTRACT

A single-ended low-swing power-savings mechanism is provided. The mechanism comprises a precharge device that turns off in an evaluation phase and a first biasing device is always on. Within the mechanism, a strength of a keeper device is changed to a first level in response to an input of the second biasing device being at a first voltage level. Within the mechanism the strength of the keeper device is changed to a second level in response to the input of the second biasing device being at a second voltage level. Responsive to receiving a (precharged voltage level read data line signal, a precharged voltage level of the first node falls faster when the keeper device is weakened to a first level. The keeper device turns on in response to receiving a LOW signal and pulls up the voltage at the first node so that a HIGH signal is output.

20 Claims, 5 Drawing Sheets

(56) References Cited

U.S. PATENT DOCUMENTS

2012/0146718 A1 6/2012 Pan et al.
2012/0176156 A1 7/2012 Chang et al.

OTHER PUBLICATIONS

Park, Sunghyun et al., "40.4fJ/bit/mm Low-Swing On-Chip Signaling with self-Resetting Logic Repeaters Embedded within a Mesh NoC in 45 nm SOI Cmos", http://projects.csail.mit.edu/wiki/pub/LSPgroup/PublicationList/SRLR_DATE2013.pdf, retrieved Apr. 2, 2013, 6 pages.

Tiebout, Marc, "Low-Power Low-Phase_noise Differentially Tuned Quadrature VCO Design in Standard CMOS", IEEE Journal of Solid-State Circuits, vol. 36, No. 7, Jul. 2001, pp. 1018-1024.

Zhang, Hui et al., "Low-Swing On-Chip Signaling Techniques: Effectiveness and Robustness", IEEE Transactions on Very Large Scale Integration (VLSI) Systems, vol. 8, No. 3, Jun. 2000, pp. 264-272.

\* cited by examiner

SINGLE-ENDED LOW-SWING POWER-SAVINGS MECHANISM WITH PROCESS COMPENSATION

BACKGROUND

The present application relates generally to an improved data processing apparatus and more specifically to a single-ended low-swing power-savings mechanism with process compensation.

Memory content on integrated circuit chips increases with each generation. However, with the power provided to the integrated circuit remaining the same and, thus, being a limiting factor, increases in memory content contributes to more and more of the total integrated circuit chip power. Thus, a current challenge is to reduce power utilized throughout the integrated circuit chip and, with the increases in memory content, the power utilized in processing memory operations without sacrificing performance.

SUMMARY

In one illustrative embodiment, a single-ended low-swing power-savings mechanism is provided. In the illustrative embodiment, the single-ended low-swing power-savings mechanism comprises a precharge device coupled to a first biasing device, where the precharge. device turns off in an evaluation phase, and where the first biasing device is always on. In the illustrative embodiment, the single-ended low-swing power-savings mechanism comprises a second biasing device coupled to a keeper device, where, responsive to an input of the second biasing device being at a first voltage level, a strength of the keeper device is changed to a first level, and where, responsive to the input of the second biasing device being at a second voltage level, the strength of the keeper device is changed to a second level. In the illustrative embodiment, the single-ended low-swing power-savings mechanism comprises a first node coupled to the precharge device, the biasing device, the keeper device, and an input of an inverting amplifier, where, responsive to receiving a precharged voltage level read data line signal, a precharged voltage level of the first node falls faster when the keeper device is weakened to a first level. In the illustrative embodiment, the single-ended low-swing power-savings mechanism comprises the keeper device coupled to an output of the inverting amplifier and a global bit line, where the keeper device turns on in response to receiving a LOW signal from the inverting amplifier and pulls up the voltage at the first node so that a HIGH signal is output onto a global data line.

In another illustrative embodiment, a memory is provided that comprises a set of memory cells and a single-ended low-swing power-savings mechanism coupled to the set of memory cells. In the illustrative embodiment, the single-ended low-swing power-savings mechanism comprises a precharge device coupled to a first biasing device, where the precharge device turns off in an evaluation phase, and where the first biasing device is always on. In the illustrative embodiment, the single-ended low-swing power-savings mechanism comprises a second biasing device coupled to a keeper device, where, responsive to an input of the second biasing device being at a first voltage level, a strength of the keeper device is changed to a first level, and where, responsive to the input of the second biasing device being at a second voltage level, the strength of the keeper device is changed to a second level. In the illustrative embodiment, the single-ended low-swing power-savings mechanism comprises a first node coupled to the precharge device, the biasing device, the keeper device, and an input of an inverting amplifier, where, responsive to receiving a precharged voltage level read data line signal, a precharged voltage level of the first node falls faster when the keeper device is weakened to a first level. In the illustrative embodiment, the single-ended low-swing power-savings mechanism comprises the keeper device coupled to an output of the inverting amplifier and a global bit line, where the keeper device turns on in response to receiving a LOW signal from the inverting amplifier and putts up the voltage at the first node so that a HIGH signal is output onto a global data line.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The current challenge in integrated circuitry is to reduce power utilized throughout the integrated circuit chip and, with the increases in memory content, the power utilized in processing memory operations without sacrificing performance. A significant portion of the power utilized in processing memory operations is within global read and write data lines. Thus, the illustrative embodiments provide a single-ended low-swing power-savings mechanism with process compensation. However, single-ended low-swing lines are susceptible to noise and process effects. That is, sensing techniques may not always scale well with process, voltage, and temperature (PVT) as well as possibly introducing significant integrated circuit (IC) complexity. Further differential techniques may leave potential changes on the table due to data state dependency for power savings. Thus, the single ended low-swing power-savings mechanism provided in accordance with the illustrative embodiments provides a single-ended low-signal swing scheme with no additional timing or circuit complexity. Further, the single ended low-swing power-savings mechanism of the illustrative embodiments provides for PVT tracking captured via a programmable reference keeper and pre-charge value tracking with negative channel field effect transistor (nFET) threshold.

Figure 1:
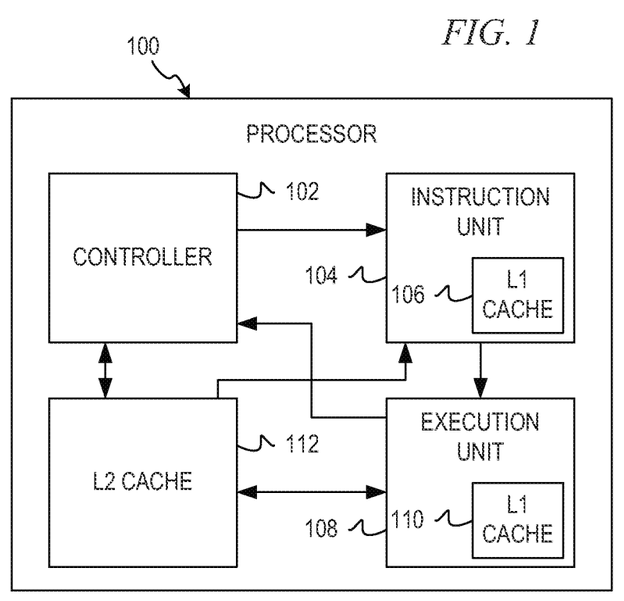
FIG. 1 is an exemplary block diagram of processor 100 in accordance with an illustrative embodiment.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention. Although, FIG. 1 depicts only level 1 (L1) cache and 2 (L2) cache, the illustrative embodiments are not limited to only these levels of memory hierarchy. That is, the illustrative embodiments may be applied to any level of memory hierarchy without departing from the spirit and scope of the invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like, In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

Figure 2:
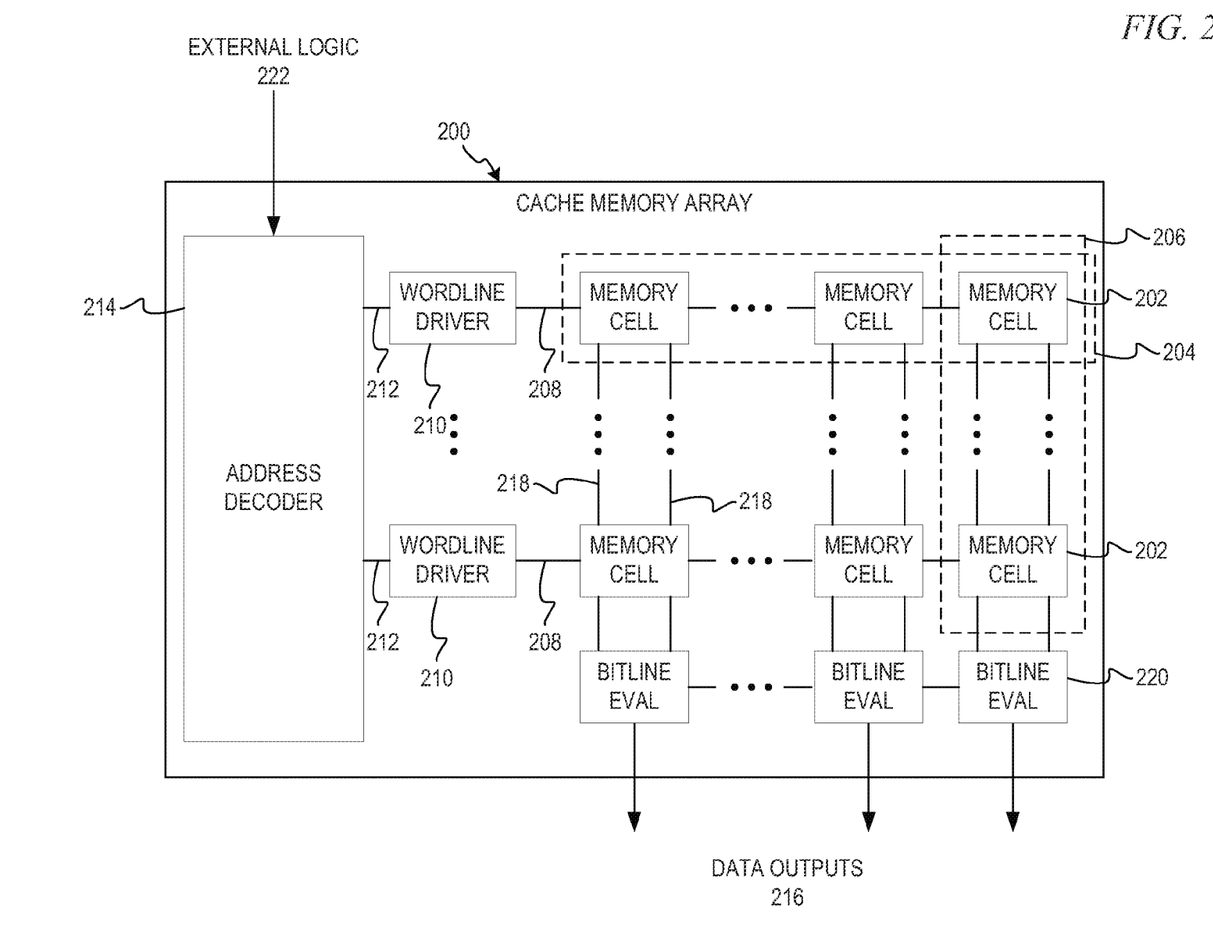
FIG. 2 illustrates a high-level example of a typical cache memory array comprising multiple memory cells in accordance with an illustrative embodiment.

The majority of power dissipated in cache memory arrays comes from the pre-charging and discharging of bit-lines during a read access. That is, the bit-lines, within the cache memory array, span the entire height of the cache memory array and tend to be highly capacitive. FIG. 2 illustrates a high-level example of a typical cache memory array 200 comprising multiple memory cells 202 in accordance with an illustrative embodiment. Memory cells 202 are arranged as an array having rows 204 and columns 206, Memory cells 202 in a particular row 204 are connected to one another by word lines 208. Word lines 208 of each row 204 are also connected to word line drivers 210 which receive output 212 from address decoder 214 that identifies which row 204 is to be output and cache memory array 200 outputs the corresponding data entry through data outputs 216. Word line driver 210 may provide a single word line or a write word line and a read word tine. Memory cells 202 in a particular column 206 are connected to one another by a pair of bit lines 218 which are driven to complimentary during read/write executions and are traditionally precharged to the voltage supply. Bit lines 218 may be true and compliment bit lines or a true write bit line, compliment write bit line, and a separate read bit line, Bit lines 218 feed sense amplifiers 220, which may also referred to as bit line evaluators, to convert the differential signal to a single-ended signal for use in logic downstream.

In operation, address decoder 214 receives an address associated with a read/write access from external logic 222. Address decoder 214 decodes the address and signals the particular one of word tine drivers 210 associated with the decoded address using output 212. The particular one of word line drivers 210 then fires due to the signal from address decoder 214 and the data in the associated row 204 of memory cells 202 is output through data outputs 216 if the access is a read access or, if the access is a write access, data is written to memory cells 202 in associated row 204.

Figure 3:
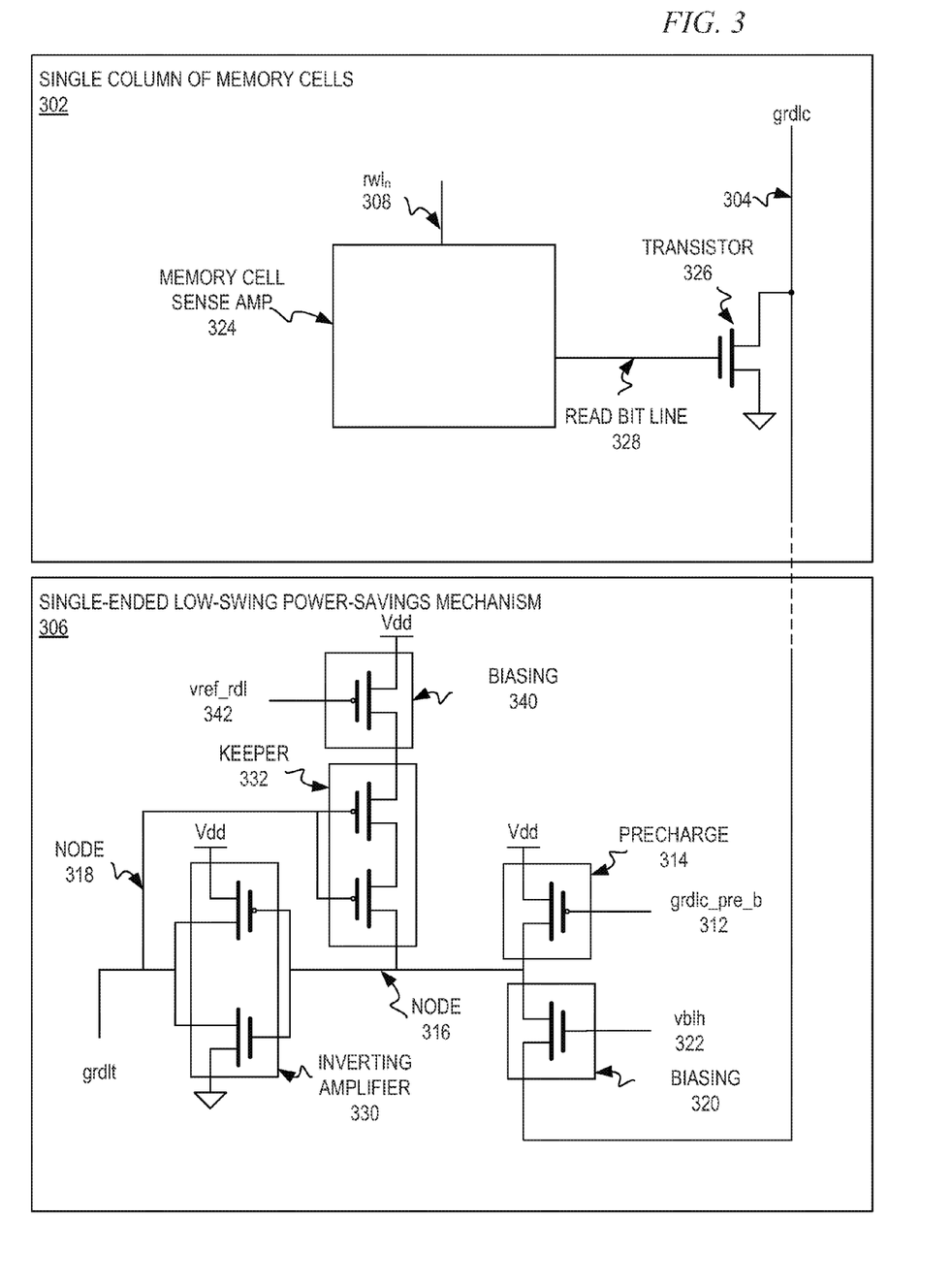
FIG. 3 depicts an exemplary block diagram of a single-ended low-swing power-savings mechanism coupled to an exemplary column of memory cells in accordance with an illustrative embodiment.

FIG. 3 depicts an exemplary block diagram of a single-ended low-swing power-savings mechanism coupled to an exemplary column of memory cells in accordance with an illustrative embodiment. Single-ended low-swing power-savings mechanism 306 comprises biasing device 320, precharge device 314, biasing device 340, keeper device 332, and inverting amplification device 330. Biasing device 320 and precharge device 314 provide for resetting the state of single-ended low-swing power-savings mechanism 306 in a precharge phase of every read operation. Biasing device 320 and keeper device 332 are crucial components of single-ended low-swing power-savings mechanism 306. That is, the voltage at node 316 determines the output state of the inverting amplification device 330.

Single-ended low-swing power-savings mechanism 306 has two phases: a precharge phase and an evaluation phase. During a read operation, an $n^{th}$ row from memory cells 302, in the precharge phase, read word line signal ($rwl_n$) 308 is LOW so that nothing is read onto the read path of read data line (grdlc) 304. Precharge signal (not shown) goes HIGH and precharge bar signal (grdlc_pre_b) 312 goes LOW. With grdlc_pre_b 312 LOW, precharge device 314 is turned on and pulls up the read data line (grdlc) 304 and node 316 to supply voltage (Vdd). Contrary to current memory devices, single-ended low-swing power-savings mechanism 306 also utilizes biasing device 320. Biasing device 320 is controlled by input signal (vblh) 322. Vblh 322 is a voltage signal that is slightly lower than Vdd, i.e. lower by some threshold voltage Vt. With vblh 322 always being at a voltage that is slightly lower than Vdd, biasing device 320 is always on. Thus, during the precharge phase, the voltage on read data line (grdlc) 304 will be at (vblh-vt). Thus, at the end of the precharge cycle, the voltage level at node 316 is Vdd and the voltage level at node 318 is ground (Gnd).

In the evaluation phase, $rwl_n$ 308 goes HIGH so that the value in memory cell sense amp 324 may be read onto the read path of read data line (grdlc) 304 via transistor 326. Also in the evaluation phase, precharge bar signal (grdlc_pre_b) 312 goes HIGH, thus precharge device 314 is turned off and the input voltage to single-ended low-swing power-savings mechanism at node 316 is (VDD) and the read data line (grdlc) 304 is at (vblh-vt). During the read, as read data line (grdlc) 304 goes to zero, by biasing device 320 being at the voltage level that is slightly lower than Vdd, the swing of read data line (grdlc) 304 is reduced, which saves the voltage required to precharge read data line (grdlc) 304 and node 316 during the next phase.

In the event that the Memory cell reads a 0, there is no discharge path from read data line (grdlc) 304 to ground and read data line (grdlc) 304 remains HIGH. Hence, node 316 remains above the switching point of inverting amplifier 330 and node 318 remains LOW. Since node 318 is LOW, keeper device 332 remains turned on and helps to keep the node 316 high by creating a positive feedback path. With node 318 being LOW, a '0' is output on node 318 as (grdlt), which is recognized by any logic downstream as being a '0' from memory cell 302.

In the event that memory cell 302 is storing a '1', read bit line 328 is Vdd and transistor 326 turns on, Hence, read data line (grdlc) 304 starts discharging through the read stack path of transistor 326. When read data line (grdlc) 304 discharges below a first predesigned voltage level, for example 750 mV, the voltage at node 316 crosses below a second predesigned voltage level, for example 300 mV, and node 318 starts a transition to HIGH due to the switching point of inverting amplifier 330. As a result, keeper device 332 turns off and pulls down read data line (grdlc) 304. However, in order to make the read even faster, single-ended low-swing power-savings mechanism 306 also provides biasing device 340 to help compensate for process variation by reducing the strength of the keeper stack transistor 332 and biasing device 340.

Figure 4:
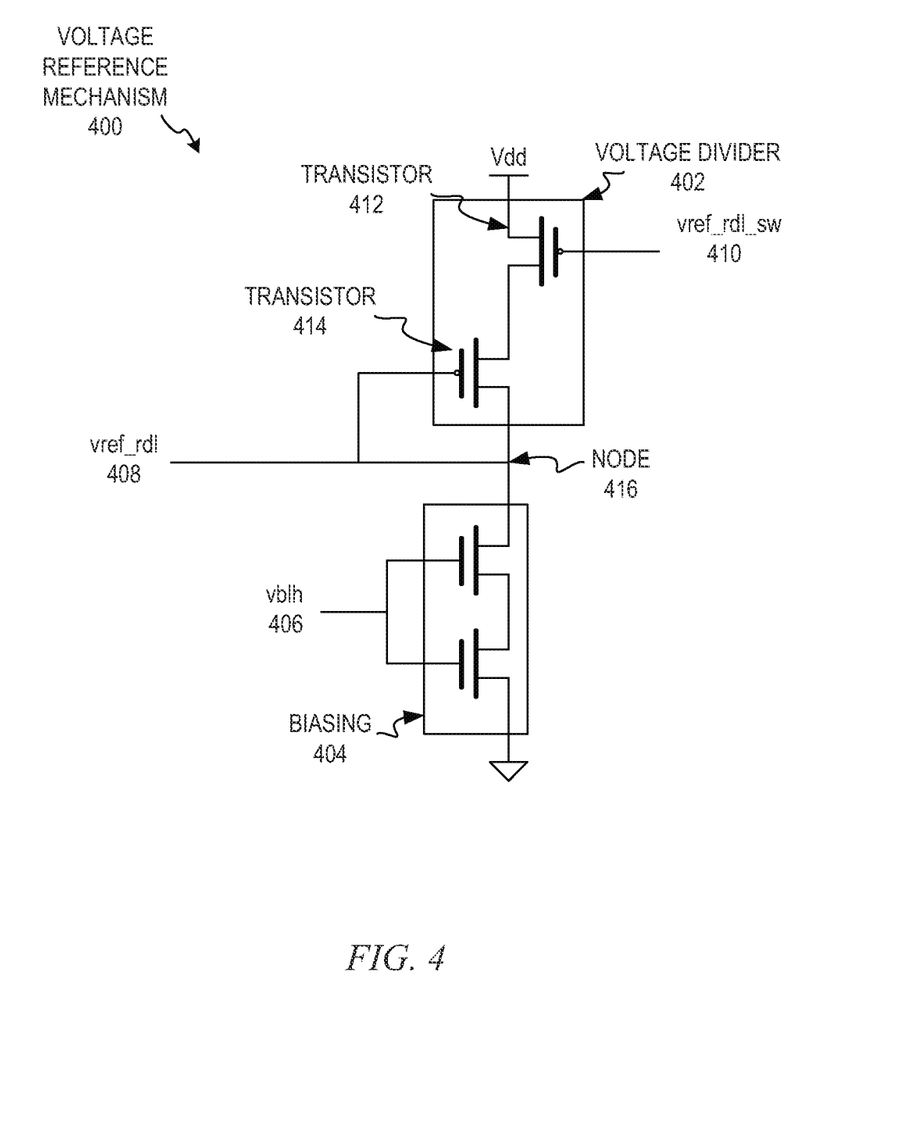
FIG. 4 depicts such a voltage-reference mechanism in accordance with an illustrative embodiment.

Biasing device 340 is controlled by a voltage-reference mechanism, which is described in detail in FIG. 4. Thus, biasing device 340 is controlled by voltage-reference signal (vref_rdl) 342. When vref_rdl 342 is LOW, then biasing device 340 is turned on, which increases the strength of keeper device 332. However, when vref_rdl 342 is HIGH, then biasing device 340 is turned off, which makes the keeper device 332 weaker. By making keeper device 332 even weaker, when a read occurs, keeper device 332 turns off faster and, thus, the read data line (grdlc) 304 and node 316 can fall faster, With node 318 being HIGH, a '1' is output on node 318 as (grdlt).

As discussed previously, biasing device 340 is controlled by a voltage-reference mechanism. FIG. 4 depicts such a voltage-reference mechanism in accordance with an illustrative embodiment. Voltage-reference mechanism 400 comprises voltage divider device 402 and biasing device 404. As with biasing device 320 of FIG. 3, biasing device 404 is controlled by input signal (vblh) 406, which is the same as input signal 322 of FIG. 3. Thus, vblh 406 is a voltage signal that is slightly lower than Vdd, i.e. lower by some threshold voltage (Vt). With vblh 406 always being at a voltage that is slightly lower than Vdd, biasing device 404 is always on and, thus, is always attempting to pull voltage-reference signal (vref_rdl) 408, which is the same as voltage-reference signal (vref_rdl) 342 of FIG. 3, to ground.

Transistor device 412 and transistor device 414 being connected in a diode fashion prevents node 416 from being pulled down to ground, thus creating a voltage divider effect, when initialized by switch signal (vref_rdl_sw) 410. This voltage divider causes vref rdl 408 to be at some voltage between ground and Vdd, depending on the strength of the pFET process. As described in relation to FIG. 3, when vref_rdl 342 is HIGH or not at ground potential, then biasing device 340 of FIG. 3 is turned off, which makes the already weak keeper device 332 of FIG. 3 even weaker.

Thus, by utilizing the single-ended low-swing power-savings mechanism of FIG. 3, significant power savings are obtained by only precharging read data line (grdlc) 304 to vblh-vt, which reduces the voltage swing on a highly-capacitive read data line (grdlc) 304. Further, by reducing the voltage swing on read data line (grdlc) 304 by precharging to a lower voltage level (vblh-vt) thereby reducing power and improving performance, the illustrative embodiments provide for the ability to increase the capacitance of read data line (grdlc) 304 by adding more memory stacks, thus enabling a higher density memory offering.

Finally, by utilizing the single-ended low-swing power-savings mechanism of FIG. 3 in conjunction with the voltage-reference mechanism of FIG. 4, (vref_rdl) 342 is process compensated by voltage-reference mechanism of FIG. 4. That is, transistor device 412 and transistor device 414 create a voltage divider as described above. As the process varies for various device strengths for pFET and nFET of voltage divider 402, the voltage on vref_rdl 408 changes. lithe pFET is stronger, the vref_rdl 408 will tend to be closer to Vdd. With vref_rdl 408 being the same as vref_rdl 342, vref_rdl 342 will be closer to Vdd and keeper 332 is made weaker, allowing for node 316 to be discharged easier, If the nFETs in biasing device 404 are stronger, then the vref_rdl 408 will be closer to ground, With vref_rdl 408 being the same as vref_rdl 342, vref_rdl 342 will be closer to ground and keeper 332 is made stronger, thus making the discharge of node 316 harder. Thus, power can be adjusted in single-ended low-swing power-savings mechanism of FIG. 3 and voltage-reference mechanism of FIG. 4 by varying the biasing voltage vblh 322 in FIG. 3 and vblh 406 of FIG. 4. Thus, if an integrated circuit device is operating slower and the intent is to balance performance and power, then the vblh voltage may be adjusted lower. Conversely, if an integrated circuit device is intended to operate at high performance, then the vblh voltage may be adjusted higher.

Thus, the illustrative embodiments provide mechanisms for a single-ended low-swing data line with process compensation. That is, the single ended low-swing power-savings mechanism provided in accordance with the illustrative embodiments provides a single-ended low-signal swing scheme with no additional timing or circuit complexity. Further, the single ended low-swing power-savings mechanism of the illustrative embodiments provides for PVT tracking captured via a programmable reference keeper and precharge value tracking with negative channel field effect transistor (NFET) threshold.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections).

In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 5:
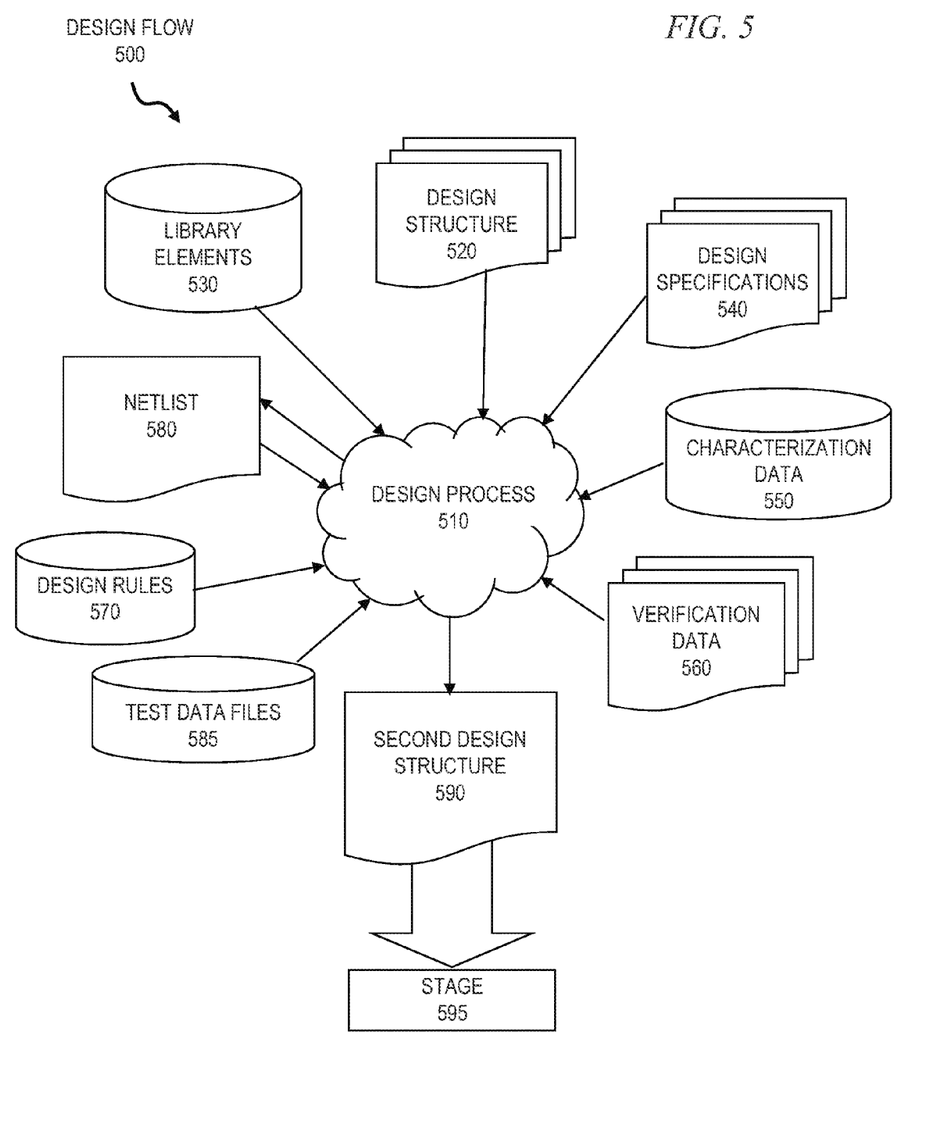
FIG. 5 shows a block diagram of an exemplary design flow used, for example, in semiconductor IC logic design, simulation, test, layout, and manufacture.

FIG. 5 shows a block diagram of an exemplary design flow 500 used, for example, in semiconductor IC logic design, simulation, test, layout, and manufacture. Design flow 500 includes processes and mechanisms for processing design structures to generate logically or otherwise functionally equivalent representations of the embodiments of the invention shown in FIGS. 3-4. The design structures processed and/or generated by design flow 500 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 3-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 3-4 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information, Design process 510 may further include modules for performing standard circuit design processes such as timing analysis, verification, design rule checking, place and route operations, etc.

Design process 510 employs and incorporates well-known logic and physical design tools such as HDL compilers and simulation model build tools to process design structure 520 together with some or all of the depicted supporting data structures to generate a second design structure 590. Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-4, In one embodiment, design structure 590 may comprise a compiled, executable HDL simulation model that functionally simulates the devices shown in FIGS. 3-4.

Design structure 590 may also employ a data format used for the exchange of layout data of integrated circuits and/or symbolic data format (e.g. information stored in a GASII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 3-4, Design structure 590 may then proceed to a stage 595 where, for example, design structure 590 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A single-ended low-swing power-savings mechanism, comprising:
    a precharge device coupled to a first biasing device, wherein the precharge device turns off in an evaluation phase and wherein the first biasing device is always on;
    a second biasing device coupled to a keeper device, wherein, responsive to an input of the second biasing device being at a first voltage level, a strength of the keeper device is changed to a first level, and wherein, responsive to the input of the second biasing device being at a second voltage level, the strength of the keeper device is changed to a second level;
    a first node coupled to the precharge device, the biasing device, the keeper device, and an input of an inverting amplifier, wherein, responsive to receiving a precharged voltage level read data line signal, precharged voltage level of the first node falls faster when the keeper device is weakened to a first level; and
    the keeper device coupled to an output of the inverting amplifier and a global bit line, wherein the keeper device turns on in response to receiving a LOW signal from the inverting amplifier and pulls up the voltage at the first node so that a HIGH signal is output onto a global data line.

2. The single-ended low-swing power-savings mechanism of claim 1, wherein, responsive to the input of the second biasing device being at a first voltage level, the keeper device is weakened to a first level and wherein, responsive to an input of the second biasing device being at a second voltage level, the keeper device is weakened to a second level.

3. The single-ended low-swing power-savings mechanism of claim 2, wherein the input of the second biasing device is received from a voltage-reference mechanism.

4. The single-ended low-swing power-savings mechanism of claim 3, wherein the voltage-reference mechanism and the second biasing device together compensates across process variation.

5. The single-ended low-swing power-savings mechanism of claim 3, wherein the voltage-reference mechanism and the second biasing device together enable operation across a wide process, voltage, and temperature (PVT) range.

6. The single-ended low-swing power-savings mechanism of claim 3, wherein the voltage-reference mechanism comprises:
    a voltage divider coupled to a third biasing device, wherein, when the input to the voltage divider is LOW, the input to the second biasing device is at the first voltage level that causes the keeper device to weaken to the first level, and wherein, when an input to the voltage divider is HIGH, the input to the second biasing device is at the second voltage level that causes the keeper device to weaken to the second level.

7. The single-ended low-swing power-savings mechanism of claim 1, wherein the keeper device turns off in response to receiving a HIGH signal from the inverting amplifier and pulls down the voltage at the first node so that a LOW signal is output onto the global data line.

8. The single-ended low-swing power-savings mechanism of claim 1, wherein, in a precharge phase, the precharge device and the first biasing device precharges the read bit line and the first node to a lower voltage level than the supply voltage and wherein, by precharging the read bit line and the first node to the lower voltage level than the supply voltage, voltage swing is reduced during a read operation thereby reducing read power.

9. The single-ended low-swing power-savings mechanism of claim 1, wherein a HIGH read data line signal indicates that a memory cell within a memory that is being read is storing a zero.

10. The single-ended low-swing power-savings mechanism of claim 1, wherein the LOW read data line signal indicates that a memory cell within a memory that is being read is storing a one.

11. A memory comprising:
    a set of memory cells; and
    a single-ended low-swing power-savings mechanism coupled to the set of memory cells, wherein the single-ended low-swing power-savings mechanism comprises:
        a precharge device coupled to a first biasing device, wherein the precharge device turns off in an evaluation phase and wherein the first biasing device is always on;
        a second biasing device coupled to a keeper device, wherein, responsive to an input of the second biasing device being at a first voltage level, a strength of the keeper device is changed to a first level, and wherein, responsive to the input of the second biasing device being at a second voltage level, the strength of the keeper device is changed to a second level;
        a first node coupled to the precharge device, the biasing device, the keeper device, and an input of an inverting amplifier, wherein, responsive to receiving a precharged voltage level read data line signal, a precharged voltage level of the first node falls faster when the keeper device is weakened to a first level; and
        the keeper device coupled to an output of the inverting amplifier and a global bit line, wherein the keeper device turns on in response to receiving a LOW signal from the inverting amplifier and pulls up the voltage at the first node so that a HIGH signal is output onto a global data line.

12. The memory of claim 11, wherein, responsive to the input of the second biasing device being at a first voltage level, the keeper device is weakened to a first level and wherein, responsive to an input of the second biasing device being at a second voltage level, the keeper device is weakened to a second level.

13. The memory of claim 12, wherein the input of the second biasing device is received from a voltage-reference mechanism.

14. The memory of claim 13, wherein the voltage-reference mechanism and the second biasing device together compensates across process variation.

15. The memory of claim 13, wherein the voltage-reference mechanism and the second biasing device together enable operation across a wide process, voltage, and temperature (PVT) range.

16. The memory of claim 13, wherein the voltage-reference mechanism comprises:
    a voltage divider coupled to a third biasing device, wherein, when the input to the voltage divider is LOW, the input to the second biasing device is at the first voltage level that causes the keeper device to weaken to the first level, and wherein, when an input to the voltage divider is HIGH, the input to the second biasing device is at the second voltage level that causes the keeper device to weaken to the second level.

17. The memory of claim 11, wherein the keeper device turns off in response to receiving a HIGH signal from the inverting amplifier and pulls down the voltage at the first node so that a LOW signal is output onto the global data line.

18. The memory of claim 11, wherein, in a precharge phase, the precharge device and the first biasing device precharges the read bit line and the first node to a lower voltage level than the supply voltage and wherein, by precharging the read bit line and the first node to the lower voltage level than the supply voltage, voltage swing is reduced during a read operation thereby reducing read power.

19. The memory of claim 11, wherein a HIGH read data line signal indicates that a memory cell within a memory that is being read is storing a zero.

20. The memory of claim 11, wherein the LOW read data line signal indicates that a memory cell within a memory that is being read is storing a one.

\* \* \* \* \*